(12) United States Patent
Williams

(10) Patent No.: US 6,430,517 B1
(45) Date of Patent: Aug. 6, 2002

(54) CIRCUITS, USER TERMINALS, AND METHODS FOR DETERMINING INFORMATION ASSOCIATED WITH PIN LIMITED DEVICES USING EXCITATIONS OF DIFFERENT FREQUENCIES

(75) Inventor: Rodney O. Williams, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/412,904

(22) Filed: Oct. 5, 1999

(51) Int. Cl.[7] ............................................. G01R 31/36
(52) U.S. Cl. ......................................... 702/63; 320/106
(58) Field of Search ........................... 702/63, 75, 130, 702/132, 64, 65, 66, FOR 103, 106, 110; 320/106; 343/702; 455/90

(56) References Cited

U.S. PATENT DOCUMENTS

| | | | | |
|---|---|---|---|---|
| 4,903,326 A | * | 2/1990 | Zakman et al. ............. 455/575 |
| 5,554,921 A | * | 9/1996 | Li et al. ..................... 320/106 |
| 5,696,433 A | * | 12/1997 | Patino ........................ 320/106 |
| 5,852,421 A | * | 12/1998 | Maldonado ................. 343/702 |
| 5,857,148 A | * | 1/1999 | Weisshappel et al. ......... 455/90 |
| 5,859,522 A | * | 1/1999 | Theobald .................... 320/106 |
| 6,018,227 A | * | 1/2000 | Kumar et al. ............... 320/106 |

* cited by examiner

Primary Examiner—Marc S. Hoff
Assistant Examiner—Mohamed Charioui
(74) Attorney, Agent, or Firm—Myers Bigel Sibley & Sajovec

(57) ABSTRACT

An information circuit for an input/output pin limited device includes an input/output pin, a first circuit path, and a second circuit path. The first circuit path is responsive to a first excitation on the input/output pin, wherein the first circuit path includes a first component device responsive to a first characteristic of the input/output pin limited device. The second circuit path is responsive to a second excitation on the input/output pin, wherein the second circuit path includes a second component device responsive to a second characteristic of the input/output pin limited device.

36 Claims, 4 Drawing Sheets

CIRCUITS, USER TERMINALS, AND METHODS FOR DETERMINING INFORMATION ASSOCIATED WITH PIN LIMITED DEVICES USING EXCITATIONS OF DIFFERENT FREQUENCIES

FIELD OF THE INVENTION

The present invention relates to the field of electronic devices in general, and more particularly, to pin limited electronic devices.

BACKGROUND OF THE INVENTION

Many electronic devices, such as radiotelephones, use a battery to provide power thereto. For example, power may be provided to a radiotelephone by an attached battery. Information associated with the battery, such as temperature and the battery type, may enable improved performance of the battery.

It is known to include an Identifier (ID) in the battery so that the type of the battery may be determined. Some batteries include resistors across which voltage levels can be developed to detect the ID of the battery. For example, the ID may identify the battery as a nickel-cadmium type battery. Accordingly, a radiotelephone to which the battery is coupled may use a set of nickel cadmium battery parameters to more accurately predict the state of the battery.

It is also known to monitor the temperature of a battery using thermistors in the battery. Monitoring the battery temperature may enable the radiotelephone to charge the battery at the proper rate, provide the proper charge termination, and reduce the likelihood of damaging the battery due to overheating during recharging. The thermistor typically provides a resistance which is inversely proportional to the temperature of the battery. Accordingly, the voltage level developed across the thermistor can indicate the temperature of the battery.

Unfortunately, using resistors and thermistors to indicate the type and temperature of the battery may limit the number of battery types that can be accurately identified. For example, it is known to connect a thermistor in series with an ID resistor in a battery. The thermistor may, for example, provide a resistance of 1K ohms to 1M ohms in response to variations in the temperature of the battery. If the ID resistor has a resistance value of about 1K ohms, the total resistance of the thermistor and the ID resistor can vary between 2K ohms to 1.002 M ohms. Accordingly, it may be difficult to accurately distinguish between more than a few battery types using different ID resistor values.

It is also known to use processors, such as single chip microcomputers, in a battery to identify the type of the battery and determine the temperature. For example, a processor may be programmed with a code to identify the battery type and be coupled to a temperature sensor to determine the temperature. The processor may then serially transmit the ID and temperature information to the electronic device (such as a radiotelephone) via a pin on the battery that electrically contacts the electronic device. Unfortunately, processors may be expensive relative to the techniques discussed above. Accordingly, there is a need for improved circuits, batteries, user terminals and methods that provide information associated with input/output in limited devices such as batteries.

SUMMARY OF THE INVENTION

It is, therefore, an object of the present invention to allow improved circuits and methods that provide information associated with input/output pin limited electronic devices.

It is also an object of the present invention to allow a reduction in the cost of providing information associated with input/output pin limited electronic devices.

It is a further object of the present invention to allow improved battery devices.

These, and other objects of the present invention, may be provided by an information circuit that includes an input/output pin electrically coupled to a first circuit path and a reference pin of the device. The first circuit path is responsive to a first excitation on the input/output pin, wherein the first circuit path includes a first component device responsive to a first characteristic of the input/output pin limited device. A second circuit path is electrically coupled between the input/output pin and the reference pin and is responsive to a second excitation on the input/output pin, wherein the second circuit path includes a second component device responsive to a second characteristic of the input/output pin limited device.

Accordingly, the present invention allows information associated with the input/output pin limited device to be transmitted via a single input/output pin, thereby allowing a reduction in the cost of determining the information. For example, the first excitation can be applied at a first frequency and the second excitation can be applied at a second frequency. Respective responses to the first excitation can identify first information associated with the input/output pin limited device and the response to the second excitation can identify second information associated with the input/output pin limited device. In one embodiment, the first excitation is an AC signal and the second excitation is a DC signal.

In another aspect of the present invention, the first component device has a first impedance associated with the first characteristic and the second component device has a second impedance associated with the second characteristic.

In another aspect of the present invention, the first characteristic is a type of input/output pin limited device and the first component device is a resistor having a selected resistance associated with the type of input/output pin limited device.

A user terminal according to the present invention includes a user terminal input/output pin. A first excitation circuit is electrically coupled to the user terminal input/output pin and generates a first excitation at a first frequency at the user terminal input/output pin. A second excitation circuit is electrically coupled to the user terminal input/output pin and generates a second excitation at a second frequency at the user terminal input/output pin. A response measurement circuit is electrically coupled to the user terminal input/output pin and measures respective first and second responses to the first and second excitations at the user terminal input/output pin.

In still another aspect of the present invention, the user terminal includes a battery device and a battery device reference pin. A battery device input/output pin electrically couples the battery device to the first and second excitation circuits and the response measurement circuit via the user terminal input/output pin, wherein a user terminal input/output pin is configured to be coupled to the battery device input/output pin.

In another aspect of the present invention, the user terminal includes a battery device housing wherein the battery device is positioned within the battery device housing and the battery device input/output pin is positioned on the battery device housing so as to electrically couple to the user terminal input/output pin. A user terminal housing wherein the first and second excitation circuits and the response measurement circuit are positioned in the user terminal housing and wherein the user terminal input/output pin is positioned in the user terminal housing so as to electrically couple to the battery device input/output pin.

A method according to the present invention includes applying a first excitation at a first frequency to an input/output pin of the battery device. Measuring a first response to the first excitation at the input/output pin of the battery device and then applying a second excitation at a second frequency to the input/output pin. Measuring a second response to the second excitation at the input/output pin.

A battery device according to the present invention includes an input/output pin and a battery information circuit. The battery information circuit includes a means for providing first information associated with the battery device to the input/output pin in response to a first excitation applied to an input/output pin of the battery device at a first frequency and a means for providing second information associated with the battery device to the input/output pin in response to a second excitation applied to the input/output pin at a second frequency.

DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As will be appreciated by one of skill in the art, the present invention may be embodied as methods or devices. Accordingly, the present invention may take the form of an entirely hardware embodiment, an entirely software embodiment or an embodiment combining software and hardware aspects. Although the present invention is described herein by reference to a radiotelephone including a battery, it will be understood that the present invention may be practiced with any electronic device that uses an input/output pin limited device such as a battery.

Figure 1:
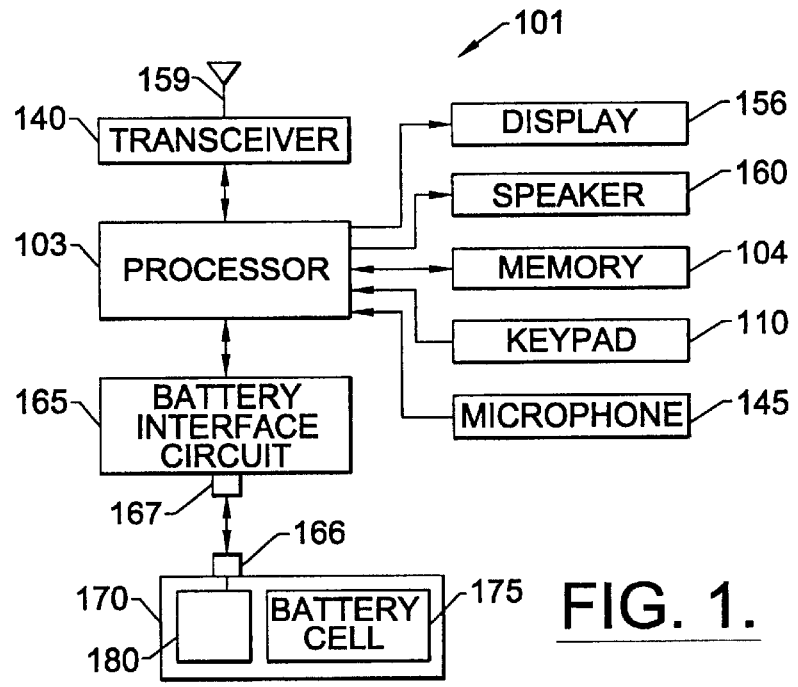
FIG. 1 is a block diagram of an embodiment of a radiotelephone according to the present invention.

FIG. 1 is a block diagram of an embodiment of a radiotelephone 101 according to the present invention. The radiotelephone 101 can be used to communicate within a wireless communications system.

Wireless communications systems are commonly employed to provide voice and data communications to subscribers. For example, analog cellular radiotelephone systems, such as those designated AMPS, ETACS, NMT-450, and NMT-900, have long been deployed successfully throughout the world. Digital cellular radiotelephone systems, such as those conforming to the North American standard IS-54 and the European standard GSM, have been in service since the early 1990's. More recently, a wide variety of wireless digital services broadly labeled as PCS (Personal Communications Services) have been introduced, including advanced digital cellular systems conforming to standards such as IS-136 and IS-95, lower-power systems such as DECT (Digital Enhanced Cordless Telephone) and data communications services such as CDPD (Cellular Digital Packet Data).

As shown in FIG. 1, the radiotelephone 101 includes a keypad 110 which can be used to provide input to the radiotelephone 101. The keypad 110 can include a plurality of keys that provide input to the radiotelephone 101 when pushed. For example, when the user wishes to initiate a call in the communications system, the user pushes a series of keys that correspond to the number to be dialed. During the call, the user can speak into a microphone 145 which causes the radiotelephone 101 to generate communication signals which are transmitted from the radiotelephone 101. The user may listen to a speaker 160 that produces audio signals generated by the radiotelephone 101 from communication signals received by the radiotelephone 101 during a call. The radiotelephone 101 transmits and receives the communication signals via a transceiver 140 over an antenna 159.

During operation, the user may refer to a display 156 of the radiotelephone 101 to observe information relevant to the operation of the radiotelephone 101, such as characters or numbers. For example, the display 156 can be a black and white Liquid Crystal Display (LCD) that displays for example, a telephone number entered by the user or a name stored in the radiotelephone 101. The display 156 may also be used in conjunction with the keypad 110 such as when the user dials a number to place a call.

A processor 103 provides the communications signals to the transceiver 140 for transmission and receives the communications signals from the transceiver for reception. For example, the processor 103 provides communications signals to the transceiver 140 when the user speaks into the microphone 145 and receives communications signals from the transceiver 140 for the reproduction of audio through the speaker 160. The processor 103 generates characters for display on the display 156. For example, the processor 103 generates numbers for display when the user enters a telephone number on the keypad 110. The characters can also be generated by a character generator which is not shown. The microphone 145, speaker 160, keypad 110, and display 156 are coupled to the processor 103 which controls operations of the radiotelephone 101.

A battery device 170 delivers power to the radiotelephone 101 during operation thereof and receives power during recharging. The battery device 170 includes a battery cell 175 that stores the power and a battery device information circuit 180 that is used to determine information or characteristics associated with the battery device 170 such as a type and a temperature of the battery device 170. The battery device 170 is accessed via a first input/output pin 166 on the battery device 170. It will be understood that other information may be provided by the battery information circuit 180.

A battery interface circuit 165 applies excitations to the battery device information circuit 180 at respective first and second frequencies via a second input/output pin 167 of the battery interface circuit 165. The battery interface circuit 165 measures the respective responses of the battery information circuit 180 to the excitations. The information associated with the battery device 170, such as type and temperature, is determined based on the respective responses to the excitations.

In one embodiment, the battery interface circuit 165 applies an Alternating Current (AC) signal as the first excitation and a Direct Current (DC) signal as the second excitation. The response to the AC current signal can be used to determine the type of the battery device 170 and the response to the DC current signal can be used to determine the temperature of the battery device 170. Although the present invention is described by reference to DC signals, it will be understood that non-zero frequency excitations can be used if the different responses of the battery information circuit 180 to the respective first and second excitation inputs are maintained.

Figure 2:
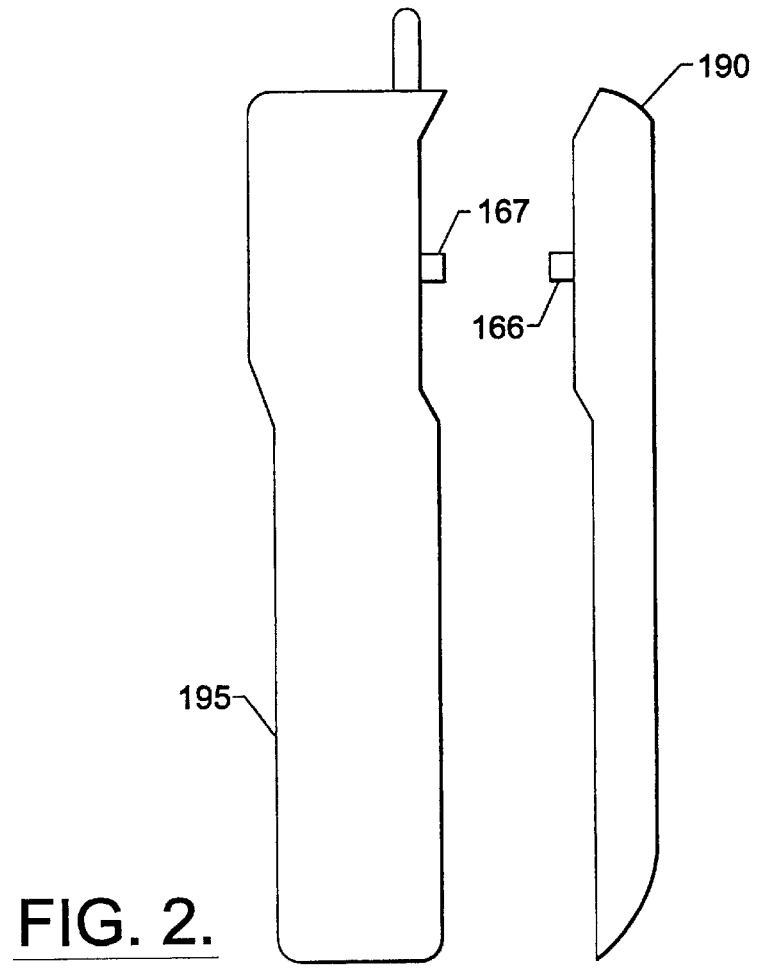
FIG. 2 is a side view of a radiotelephone housing and a battery device housing according to an embodiment of the present invention.

The battery device 170 and the radiotelephone 101 may be located in a common housing or in separate housings that can be coupled together. FIG. 2 illustrates a battery device housing 190 that houses the battery device 170 and a radiotelephone housing 195 that houses the other elements of the radiotelephone 101 described above. The first input/output pin 166 of the battery device 170 and second input/output pin 167 of the radiotelephone 101 are positioned on the battery device housing 190 and the radiotelephone housing 195 respectively to be in contact when the battery device housing 190 is coupled to the radiotelephone housing 195.

Figure 3:
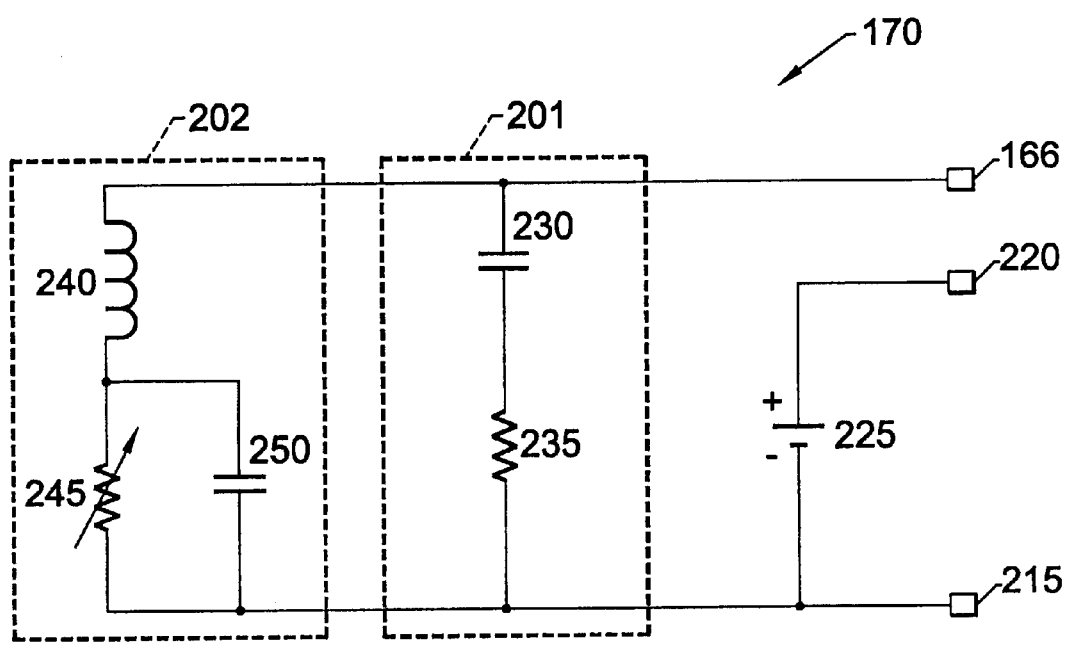
FIG. 3 is a circuit diagram of the battery device shown in FIG. 1.

FIG. 3 is a circuit diagram of an embodiment of the battery device 170 shown in FIG. 1. As shown in FIG. 3, the battery information circuit 180 includes a first circuit path 201 and a second circuit path 202. The first circuit path includes a first capacitor 230 electrically coupled in series with an ID resistor 235 between the first input/output pin 166 and a reference pin 215 of the battery device 170. The resistance of the ID resistor 235 can be selected, for example, to identify the type of the battery device. For example, a first resistance of 10 ohms can identify a first type and a second resistance of 100 ohms can identify a second type of battery device 170.

The second circuit path 202 includes a second capacitor 250 electrically coupled in parallel with a thermistor 245. The parallel combination of the second capacitor 250 and the thermistor 245 is electrically coupled in series with an inductor 240 between the first input/output pin 166 and the reference pin 215 of the battery device 170. The resistance of the thermistor 245 is preferably inversely proportional to the temperature of the battery cell 225. The thermistor 245 is positioned to be thermally coupled to the heat generating components of the battery device 170 such as the battery cell 175.

In operation, the first and second excitations are applied to the battery information circuit 170 via the first input/output pin 166 electrically coupled to input/output pin 167. The responses by the battery information circuit 170 to the respective excitations are used to determine the information associated with the battery device 170. The responses provided by the battery information circuit 170 depend on the frequencies of the respective excitations.

According to the present invention, the values of the components included in the first circuit path 201 are selected to cause the first circuit path 201 to have a low impedance at the first frequency compared to the impedance of the second circuit path 201 at the same frequency. Accordingly, a proportionally greater amount of current flows in the first circuit path 201 thereby causing the first voltage level developed between the first input/output pin 166 and the reference pin 215 to be substantially a fraction of the impedance of the components of the first circuit path 201. The first voltage level can be measured to determine first information associated with the battery device 170.

Similarly, the values of the components included in the second circuit path 202 can be selected to cause the second circuit path 202 to have low impedance at the second frequency compared to the impedance of the first circuit path 201 at the same frequency. Accordingly, a proportionally greater amount of current flows in the second circuit path 202 thereby causing the second voltage level developed between the first input/output pin 166 and the reference pin 215 to be substantially a fraction of the impedance of the components of the second circuit path 202. The second voltage level can be measured to determine second information associated with battery device 170.

As shown in FIG. 3, the impedance of the first circuit path is:

$$Z_{1st} = (\omega_{1st} C_{230})^{-1} + R_{235} \tag{1}$$

where $\omega_{1st}$ is the frequency of the first current signal, $C_{230}$ is the capacitance of the first capacitor 230, and $R_{235}$ is the resistance of the ID resistor 235.

The impedance of the second circuit path 202 is:

$$Z_{2nd} = \omega_{2nd} L_{240} + (R_{245} \| \omega_{2nd} C_{250}) \tag{2}$$

where $\omega^{2nd}$ is the frequency of the second current signal, $C_{250}$ is the capacitance of the second capacitor 250, and $R_{245}$ is the resistance of the thermistor 245. The first frequency is selected to attenuate the impedance provided by the first circuit path 201 relative to the second circuit path 202. The second frequency is selected to attenuate the impedance provided by the second circuit path 202 relative to the first circuit path 201. For example, the first frequency can be about 10 MHz and the second frequency can be about 0.0 MHz (DC signal).

The combined impedance of the first and second circuit paths 201, 202 is:

$$Z_{comb} = Z_{1st} \| Z_{2nd}. \tag{3}$$

According to the present invention, the value of the components included in the first and second circuit paths 201, 202 are preferably selected to provide substantially complementary responses to the first and second excitations. For example, the value of the components included in the first circuit path 201 are preferably selected to provide a response to the first excitation of a relatively large magnitude at the first input output pin 166 without substantially affecting the response to the second excitation at the first input/output pin 166. Correspondingly, the components included in the second circuit path 202 are preferably selected to provide a response to the second excitation of a relatively large magnitude at the input/output pin 166 without substantially affecting the response to the first excitation at the first input/output pin 166. For the illustrated embodiment of FIG. 3, this is provided by use of a current regulated excitation and providing one path with a relatively high impedance at relatively high frequencies and a relatively low impedance at relatively low frequencies with the substantially opposite characteristics in the other path.

Similarly, the value of the components included in the second circuit path 202 are preferably selected to provide a response to the second excitation of a relatively large magnitude while the components included in the first circuit path 201 are preferably selected to provide a response of a relatively low magnitude, thereby allowing the second circuit path 202 to dominate the overall response of the battery measurement circuit 170 to the second excitation.

In an exemplary embodiment according to the present invention, capacitor 230 ($C_{230}$) is about 6.8 nanoFarads (nF), capacitor 250 ($C_{250}$) is about 6.8 nF, inductor 240 ($L_{240}$) is about 100 microhenry, resistor 245 ($R_{245}$) operates in a range between about 1K ohms to 1M ohms, depending on its temperature, the first excitation is a current signal having a frequency of about 1 MHz, and the second excitation is a DC signal. The AC signal is used to determine the type of the battery device 170 and the DC signal is used to determine the temperature of the battery device 170.

When the AC signal is applied, the impedance of the first circuit path 201 is given generally by equation (1) where the impedance of the capacitor 230 is relatively low due to the frequency of the first excitation (10 MHz). Therefore, the magnitude of the impedance $Z_{1st}$ is dominated by the ID resistor 235 which can be expressed as:

$$Z_{1st\ R=R235} \qquad (4)$$

The impedance of the second circuit path 202 is given generally by equation (2) where the impedance of the inductor 240 is relatively high, due the frequency of the first excitation (10 MHz), and the impedance of the second capacitor 250 is relatively low (about 2.3 due the frequency of the first excitation (10 MHz)). Therefore, the impedance $Z_{2nd}$ is dominated by the impedance of the inductor 240 at 10 MHz (about 6.28K ohms) which can be expressed as:

$$Z_{2nd} \approx 6.28K + (1M \| 2.3). \qquad (5)$$

Equation (5) can be further simplified by assuming that the impedance of the parallel combination of the thermistor 245 and the second capacitor 250 is about equal to zero which can be expressed as:

$$Z_{2nd} \approx 6.28K. \qquad (6)$$

Therefore, the impedance of the parallel combination of $Z_{1st}$ and $Z_{2nd}$ can be expressed as:

$$Z_{1st\|Z2nd} \approx R_{235} \| 6.28K \qquad (7)$$

and ranges between about 0 ohms and 6.28K ohms depending on the resistance value selected for the ID resistor 235.

The type of the battery device can be indicated by selecting a respective resistance value for the ID resistor 235 to be associated with the type. For example, a nickel cadmium type battery device can be identified by selecting a 1 ohm resistor as the ID resistor 235 and a lithium ion battery device type can be identified by selecting a 10 ohm resistor as the ID resistor 235. In operation, the type of the battery device 170 can be determined by measuring the voltage level that develops across the first input/output pin 166 and the reference pin 215 and solving for the value of the ID resistor 235 responsive to the AC signal.

Figure 4:
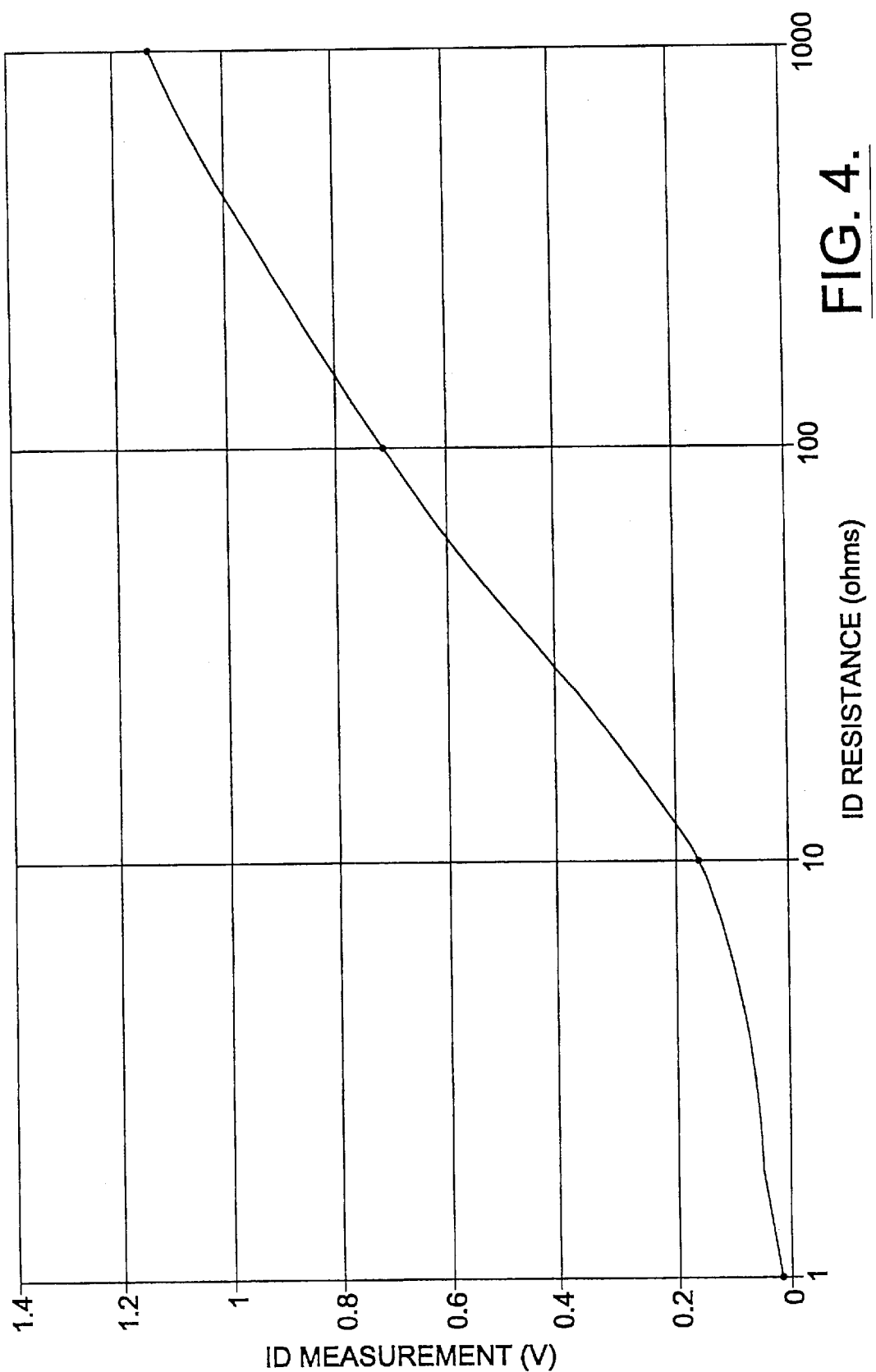
FIG. 4 is a graph that illustrates voltage levels associated with battery ID at the input/output pin of the battery device shown in FIG. 3 at an excitation of 10 MHz.

An exemplary response to the AC signal is shown in FIG. 4. According to FIG. 4, a respective voltage level (response) is shown for four values of the ID resistor 235. For example, a resistance of about 1 ohm provides a response of about 0.02 volts and a resistance of about 100 ohms provide a response of about 0.7 volts. Accordingly, the relationship between the resistance of the ID resistor 235 and the response shown in FIG. 4 can be used to determine the type of the battery device 170.

When the DC signal is applied, the impedance of the first circuit path 201 is given by equation (1) where impedance of the first capacitor 230 is relatively high due to the low frequency of the DC signal. Accordingly, the first circuit path 201 is essentially an open circuit which can be expressed as:

$$Z_{1st} \approx \infty \qquad (8)$$

The impedance of the second circuit path 202 is given by equation (2) where the impedance of the inductor 240 can be ignored (less than about 10 ohms) and the impedance of the second capacitor 250 is essentially an open circuit or:

$$Z_{2nd} \approx R_{245} \qquad (9)$$

Therefore, the impedance of the parallel combination of $Z_{1st}$ and $Z_{2nd}$ in response to the DC signal can be estimated as the impedance of the thermistor 245 ($R_{245}$). The value of the thermistor 245 can be expressed as:

$$R_{245} \approx \frac{V}{I} \qquad (10)$$

where V is voltage level developed between the first input/output pin 166 and the reference pin 215 in response to the DC signal and I is the magnitude of the DC signal. The temperature of the battery device 170 can be determined based on the resistance value of the thermistor 245. For example, the resistance of the thermistor 245 can be inversely proportional to the temperature of the battery device 170.

Figure 5:
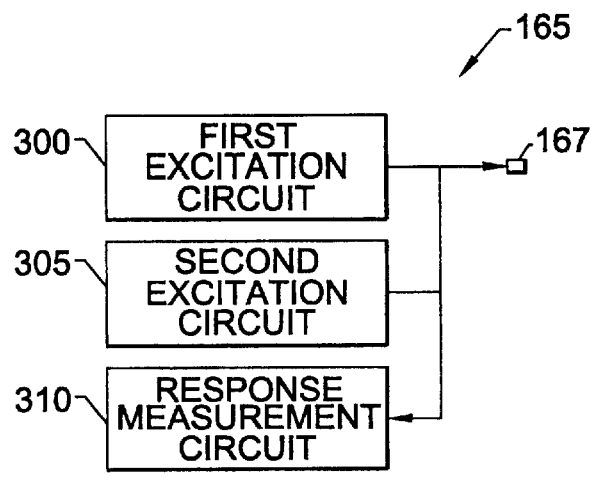
FIG. 5 is a block diagram of the battery interface circuit shown in FIG. 1.

FIG. 5 is a block diagram of the battery interface circuit 310 shown in FIG. 1. The battery interface circuit 310 includes first excitation circuit 300 and second excitation circuit 305 that provide respective first and second excitations to the battery device 170 via the second input/output pin 167. A response measurement circuit 310 measures the respective responses to the first and second excitations at the second input/output pin 166 to determine the information associated with the battery device 170.

Figure 6:
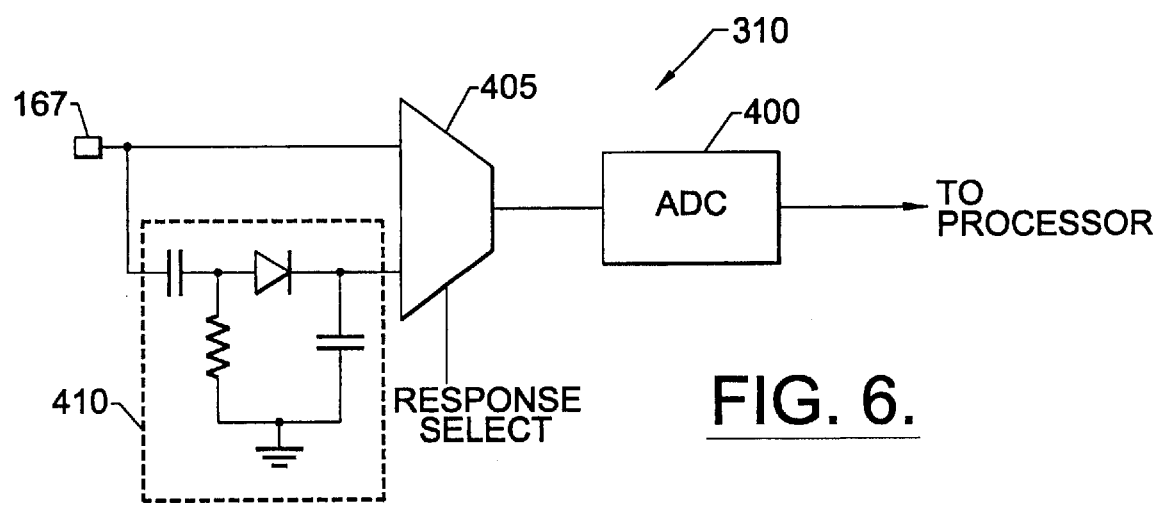
FIG. 6 is a block diagram of the response measurement circuit shown in FIG. 5.

FIG. 6 is a circuit diagram of an embodiment of the battery interface circuit 310 shown in FIG. 5. As shown in FIG. 6, the AC response is coupled to a conditioning circuit 410 that rectifies and filters the AC response. The filtered and rectified AC response and the DC response are provided to separate inputs of a multiplexer 405. The multiplexer 405 selects one of the responses to be provided to the Analog to Digital Converter (ADC) 400. The ADC 400 converts the selected input from an analog format to a digital format to enable, for example, operations by the processor 103 on the responses. The digitized responses are processed to determine the information associated with the battery device 170 such as the type and temperature of the battery device 170.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A user terminal, comprising:
   a user terminal input/output pin;
   a first excitation circuit, electrically coupled to the user terminal input/output pin, that generates a first excitation at a first frequency at the user terminal input/output pin;

a second excitation circuit, electrically coupled to the user terminal input/output pin, that generates a second excitation at a second frequency at the user terminal input/output pin; and a response measurement circuit, electrically coupled to the user terminal input/output pin, that measures respective first and second responses to the first and second excitations at the user terminal input/output pin.

2. The user terminal of claim 1 further comprising:

a battery device;

a battery device reference pin;

a battery device input/output pin that electrically couples the battery device to the first and second excitation circuits and the response measurement circuit via the user terminal input/output pin; and wherein a user terminal input/output pin is configured to be coupled to the battery device input/output pin.

3. The user terminal of claim 2, wherein the battery device comprises:

a first circuit path, electrically coupled between the battery device input/output pin and the battery device reference pin, selected to be responsive to the first excitation, wherein the first circuit path includes a first component device responsive to a first characteristic of the battery device; and a second circuit path, electrically coupled between the battery device input/output pin and the battery device reference pin, selected to be responsive to the second excitation, wherein the second circuit path includes a second component device responsive to a second characteristic of the battery device.

4. The user terminal of claim 3, wherein the first component device has a first impedance associated with the first characteristic and the second component device has a second impedance associated with the second characteristic.

5. The user terminal of claim 3, wherein the first characteristic comprises a type of battery device and the first component device comprises a resistor having a selected resistance associated with the type of battery device.

6. The user terminal of claim 3, wherein the second characteristic comprises a temperature of the battery device and the second component device comprises a thermistor thermally coupled to the input/output pin limited device.

7. The user terminal of claim 2 further comprising:

a battery device housing wherein the battery device is positioned within the battery device housing and the battery device input/output pin is positioned on the battery device housing so as to electrically couple to the user terminal input/output pin; and a user terminal housing wherein the first and second excitation circuits and the response measurement circuit are positioned in the user terminal housing and wherein the user terminal input/output pin is positioned in the user terminal housing so as to electrically couple to the battery device input/output pin.

8. The user terminal of claim 2, wherein the first excitation comprises an AC signal and the second excitation comprises a DC signal.

9. The user terminal of claim 2, wherein the first frequency is about 10 MHz.

10. The user terminal of claim 2, wherein the user terminal comprises a mobile user terminal.

11. The user terminal of claim 2, wherein the first and second excitations comprise respective first and second current signals.

12. An information circuit for an input/output pin limited device, the information circuit comprising:

an input/output pin;

a first circuit path, electrically coupled between the input/output pin and a reference pin of the device, selected to be responsive to a first excitation at a first frequency on the input/output pin, wherein the first circuit path includes a first component device responsive to a first characteristic of the input/output pin limited device; and a second circuit path, electrically coupled between the input/output pin and the reference pin, selected to be responsive to a second excitation at a second frequency on the input/output pin, wherein the second circuit path includes a second component device responsive to a second characteristic of the input/output pin limited device.

13. The information circuit of claim 12, wherein the first excitation comprises an AC signal and the second excitation comprises a DC signal.

14. The information circuit of claim 12, wherein the first component device has a first impedance associated with the first characteristic and the second component device has a second impedance associated with the second characteristic.

15. The information circuit of claim 12, wherein the first characteristic comprises a type of input/output pin limited device and the first component device comprises a resistor having a selected resistance associated with the type of input/output pin limited device.

16. The information circuit of claim 12, wherein the second characteristic comprises a temperature of the input/output pin limited device and the second component device comprises a thermistor thermally coupled to the input/output pin limited device.

17. The information circuit of claim 12, wherein the input/output pin limited device comprises a battery device.

18. The information circuit of claim 12, wherein the first frequency is about 10 MHz.

19. The information circuit of claim 12, wherein the first and second excitations comprise respective first and second current regulated signals.

20. A method of determining information associated with a battery device, the method comprising the steps of:

applying a first excitation at a first frequency to an input/output pin of the battery device;

measuring a first response to the first excitation at the input/output pin of the battery device; and then applying a second excitation at a second frequency to the input/output pin; and measuring a second response to the second excitation at the input/output pin.

21. The method of claim 20, wherein the step of measuring a second response comprises the steps of:

processing a voltage level at the input/output pin; and determining a battery device temperature based on the voltage level.

22. The method of claim 21, wherein the step of processing comprises the step of converting the voltage level from an analog format to a digital format.

23. The method of claim 20, wherein the first response comprises a type of the battery device and the second response comprises a temperature of the battery device.

24. The method of claim 20, wherein at least one of the first excitation or the second excitation comprises an AC signal and the other one of the first or second excitation comprises a DC signal.

25. The method of claim 20, wherein the first and second excitations comprise respective first and second current regulated signals.

26. The method of claim 20, wherein the step of measuring a first response comprises the steps of:
processing a voltage level at the input/output pin; and
determining a type of the battery device based on the voltage level.

27. A battery device comprising:
an input/output pin; and
a battery information circuit including:
means for providing first information associated with the battery device to the input/output pin in response to a first excitation applied to an input/output pin of the battery device at a first frequency; and
means for providing second information associated with the battery device to the input/output pin in response to a second excitation applied to the input/output pin at a second frequency.

28. The battery device of claim 27, wherein the first information comprises a type of the battery device and the second information comprises a battery device temperature.

29. The battery device of claim 27, wherein the first excitation comprises an AC signal and the second excitation comprises a DC signal.

30. The battery device of claim 27, wherein the first and second excitations comprise respective first and second current signals.

31. The battery device of claim 27, wherein the means for providing first information comprises a first passive circuit and the means for providing second information comprises a second passive circuit.

32. The battery device of claim 27 further comprising:
a battery cell that stores energy provided to the battery device and that delivers energy stored by the battery cell from the battery cell.

33. The battery device of claim 27, wherein the means for providing first information comprises:
a resistor having a selected resistance associated with a type of the battery device; and
a capacitor, electrically coupled in series with the resistor.

34. The battery device of claim 27, wherein the means for providing second information comprises:
a thermistor thermally coupled to the battery cell circuit; and
an inductor, electrically coupled in series with the thermistor.

35. An information circuit for connection to a pin of an electronic device that is configured to generate excitations at the pin, the circuit comprising:
a first circuit configured to be coupled between a reference signal node and the pin of the electronic device, the first circuit providing a first impedance between the pin and the reference signal node in response to a first excitation at a first frequency to indicate a first characteristic of the electronic device; and
a second circuit configured to be coupled between the reference signal node and the pin of the electronic device, the second circuit providing a second impedance between the pin and the reference signal node in response to a second excitation at a second frequency to indicate a second characteristic of the electronic device.

36. An information circuit according to claim 35 wherein first and second circuits include frequency dependent components that provide the first and second impedances in response to the first and second excitations at the first and second frequencies.

* * * * *